(12) United States Patent
Andrews et al.

(10) Patent No.: US 6,998,539 B2
(45) Date of Patent: Feb. 14, 2006

(54) STANDOFF/MASK STRUCTURE FOR ELECTRICAL INTERCONNECT

(75) Inventors: John R. Andrews, Fairport, NY (US); Bradley J. Gerner, Rochester, NY (US); Richard Schmachtenberg, III, Aloha, OR (US); Chad Slenes, Newberg, OR (US); Samuel V. Schultz, Wilsonville, OR (US)

(73) Assignee: Xerox Corporation, Stamford, CT (US)

( * ) Notice: Subject to any disclaimer, the term of this patent is extended or adjusted under 35 U.S.C. 154(b) by 346 days.

(21) Appl. No.: 10/447,169

(22) Filed: May 27, 2003

(65) Prior Publication Data

US 2004/0238208 A1     Dec. 2, 2004

(51) Int. Cl.
*H05K 1/02*          (2006.01)

(52) U.S. Cl. .................. 174/259; 174/258; 174/257

(58) Field of Classification Search ................ 174/253, 174/257, 255, 260, 258, 259
See application file for complete search history.

(56) References Cited

U.S. PATENT DOCUMENTS

| | | | | |
|---|---|---|---|---|
| 4,348,253 A | * | 9/1982 | Subbarao et al. ........... | 438/667 |
| 5,796,590 A | * | 8/1998 | Klein .......................... | 361/774 |
| 6,005,198 A | * | 12/1999 | Gregoire ..................... | 174/262 |
| 6,148,512 A | | 11/2000 | Brown ........................ | 29/837 |
| 2003/0180448 A1 | * | 9/2003 | Brook-Levinson et al. ... | 427/96 |

* cited by examiner

*Primary Examiner*—Kamand Cuneo
*Assistant Examiner*—Yuriy Semenenko
(74) *Attorney, Agent, or Firm*—Manuel Quioque

(57) ABSTRACT

A multi-layer standoff/mask structure including a standoff having a plurality of standoff openings and a mask having a plurality of mask openings aligned with the standoff openings.

25 Claims, 4 Drawing Sheets

FIG. 3
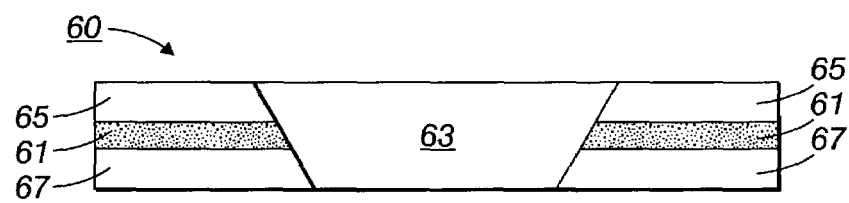
FIG. 4
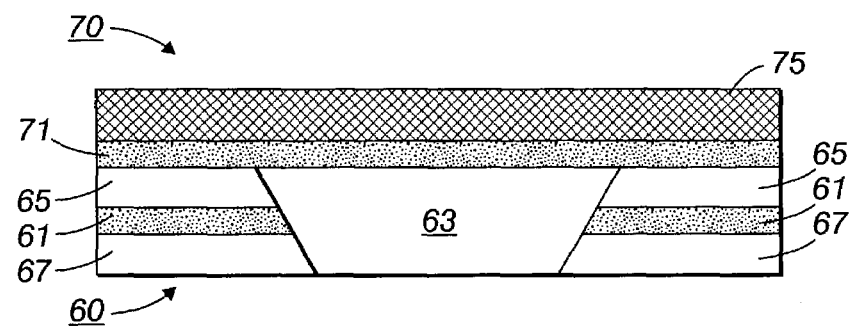
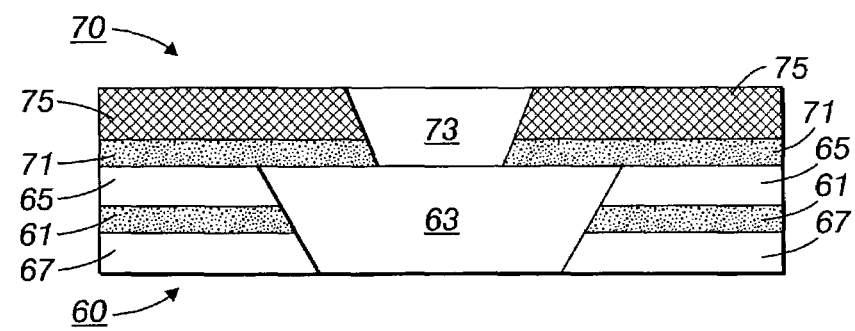
FIG. 5

STANDOFF/MASK STRUCTURE FOR ELECTRICAL INTERCONNECT

BACKGROUND OF THE DISCLOSURE

The subject disclosure is generally directed to techniques for interconnecting circuit structures.

Circuit structures such as circuit boards, integrated circuit die, and circuit packages are mechanically and/or electrically interconnected by a variety of techniques and it can be difficult to reliably and efficiently mechanically and electrically interconnect circuit structures.

BRIEF DESCRIPTION OF DRAWINGS

FIGS. 3, 4, 5, 6, 7, 8 and 9 are schematic transverse cross-sectional views illustrating various stages in the manufacture of the interconnected circuit structure of FIG. 1.

DETAILED DESCRIPTION OF THE DISCLOSURE

Figure 1:
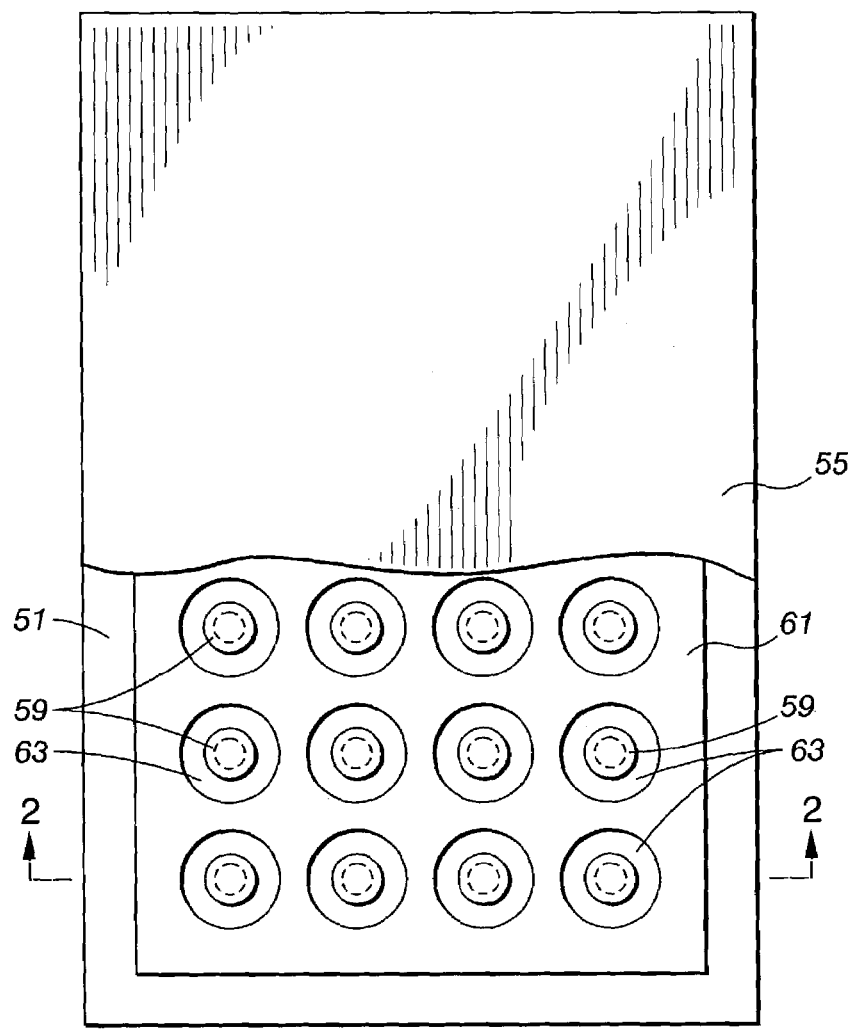
FIG. 1 is a schematic plan view of an embodiment of an interconnected electrical circuit structure.
Figure 2:
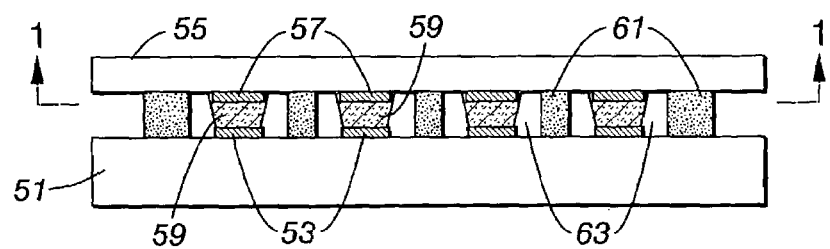
FIG. 2 is a schematic elevational view of the interconnected electrical circuit structure of FIG. 1.

FIG. 1 and FIG. 2 are a schematic plan view and a schematic elevational cross-sectional view of an embodiment of an interconnected circuit structure that can be made using techniques disclosed herein. The circuit structure includes a first electrical circuit structure 51 that includes a plurality of contact regions 53. The circuit structure further includes a second electrical circuit structure 55 that a plurality of contact regions 57. The contact regions 53 of the first circuit structure 51 are aligned with the contact regions 57 of the second circuit structure 55. The contact regions 53 are electrically interconnected to corresponding contact regions 57 by conductive islands or bumps 59. A patterned standoff structure 61 is disposed between the first circuit structure and the second circuit structure. The standoff structure 61 includes a plurality of apertures 63, each of which surrounds an interconnection of a contact region 53, a conductive bump 59, and a contact region 57. By way of illustrative example, the patterned standoff structure 61 comprises an adhesive layer.

Each of the first and second electrical circuit structures 51, 55 can comprise a circuit board, a flexible circuit, an electromechanical device, an integrated circuit die, a semiconductor package, a thick film circuit, a ceramic circuit board, or any other electrical circuit structure that includes a plurality of contact regions that need to be electrically connected to another electrical circuit structure.

FIGS. 3–9 show examples of various steps that can be used to make the interconnected circuit structure of FIG. 1.

In FIG. 3, vias or apertures 63 are formed in a laminate structure 60 that includes an adhesive layer 61 disposed between a front liner layer 65 and a back liner layer 67. The laminate structure 60 can comprise a multi-layer tape, for example. The adhesive layer 61 will subsequently implement the standoff 61 of the interconnected circuit structure of FIGS. 1 and 2. The front and back liner layers 65, 67 can each be a flexible layer and can comprise polyester, polyimide, polyamide, polyetherimide, polysulfone, polyethersulfone, polyetheretherketone, or polyphenylenesulfide, for example. The front and back liners 65, 67 can each have a thickness in the range of about 5 micrometers to about 250 micrometers. Alternatively, the front and back liners 65, 67 can each have a thickness in the range of about 10 micrometers to about 100 micrometers. By way of specific example, each of the front and back liners 65, 67 can have a thickness of about 37 micrometers.

The adhesive standoff layer 61 can comprise a single layer or a double-sided tape, for example. The adhesive standoff layer 61 can further be formed of an acrylic, epoxy, phenolic, polyimide, and/or silicone adhesive, for example, and can comprise a thermoset adhesive or a contact adhesive. The adhesive standoff layer 61 can have a thickness in the range of about 1 micrometer to about 500 micrometers. Alternatively, the adhesive standoff layer 61 can have a thickness in the range of about 10 micrometers to about 100 micrometers. By way of specific example, the adhesive standoff layer 61 can have a thickness of about 25 micrometers.

The apertures 63 can be made by laser cutting, drilling, punching or die cutting, for example. Laser cutting of the apertures 63 can be performed with galvanometer-scanned lasers such as $CO_2$ or diode-pumped solid state lasers. In another emobodiment, cutting of the apertures 63 can be performed over extended areas with an excimer laser using either a contact mask or a projection mask to pattern the apertures. By way of illustrative example, the apertures 63 can be circular or round and can have a diameter in the range of about 8 micrometers to about 500 micrometers. The apertures 63 can be spaced at a center to center spacing in the range of about 1.1 times their diameter to about 2 times their diameter. As another example, the center to center spacing can be in the range of about 1.1 times the diameter to about 10 times the diameter. The apertures 63 can also be elliptical, rectangular, or any suitable shape that can achieve the intended electrical interconnection.

In FIG. 4, a laminate mask structure 70 is applied to the apertured laminate structure 60. The laminate mask structure 70 comprises a mask adhesive layer 71 and a mask liner layer 75, and can comprise a multi-layer tape, for example. The mask liner layer 75 can be a flexible layer and can comprise polyester, polyimide, polyamide, polyetherimide, polysulfone, polyethersulfone, polyetheretherketone, or polyphenylenesulfide, for example. The mask liner layer 75 can have a thickness in the range of about 1 micrometer to about 500 micrometers. Alternatively, the mask liner layer 75 can have a thickness in the range of about 10 micrometers to about 100 micrometers. By way of specific example, the mask liner layer 75 can have a thickness of about 25 micrometers. The mask adhesive layer 71 can comprise a contact adhesive such as silicone or acrylic, and can have a thickness in the range of about 1 to 500 micrometers. Alternatively, the mask adhesive layer can have a thickness in the range of about 5 micrometers to about 50 micrometers. The mask adhesive layer 71 can also comprise a UV curable adhesive.

In FIG. 5, mask apertures 73 in alignment with the apertures 63 of the laminate structure 60 are formed in the laminate mask structure 70. For example, at the same cutting station where the apertures 63 were formed or at a different cutting station, a cutting tool such as a laser cutting tool is aligned to the apertures 63 in the laminate structure 60, and mask apertures 73 are formed. The alignment can be achieved by machine vision, for example. Laser cutting of the mask apertures 73 can be performed with galvanometer-scanned lasers such as $CO_2$ or diode-pumped solid state lasers. In another embodiment, cutting of the mask apertures 73 can be performed over extended areas with an excimer laser using either a contact mask or a projection mask to pattern the apertures. By way of illustrative example, the mask apertures 73 can be circular with a diameter in the range of about 5 micrometers to about 250 micrometers. The mask apertures can also be of other suitable shapes.

Figure 6:
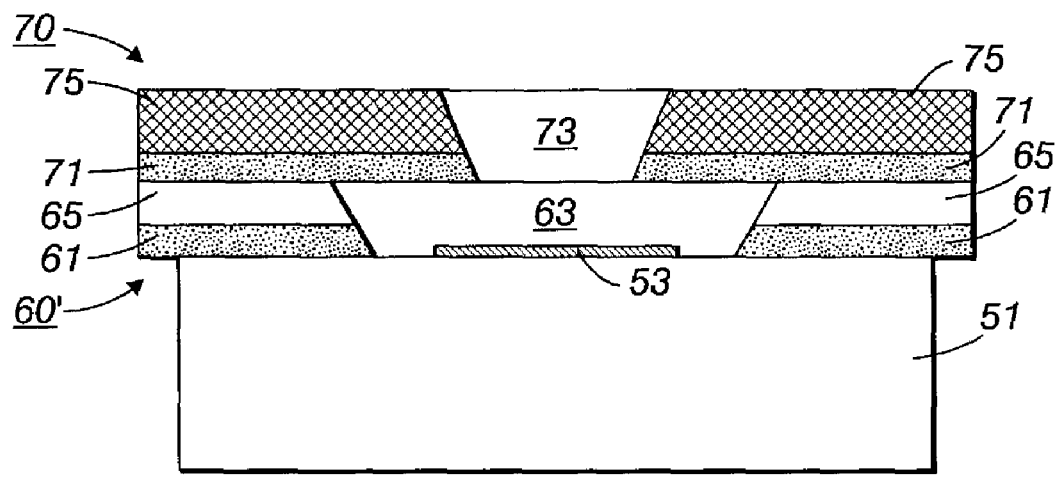

In FIG. 6, the back liner 67 is removed from the laminate structure 60 and the remaining standoff/mask laminate structure comprising the standoff adhesive layer 61, the front liner 65, the mask adhesive layer 71, and the mask liner layer 75 is attached to a first electrical structure 51, for example by heat staking. The front liner 65 and the standoff adhesive layer 61 comprise a standoff carrying laminate structure 60'.

Figure 7:
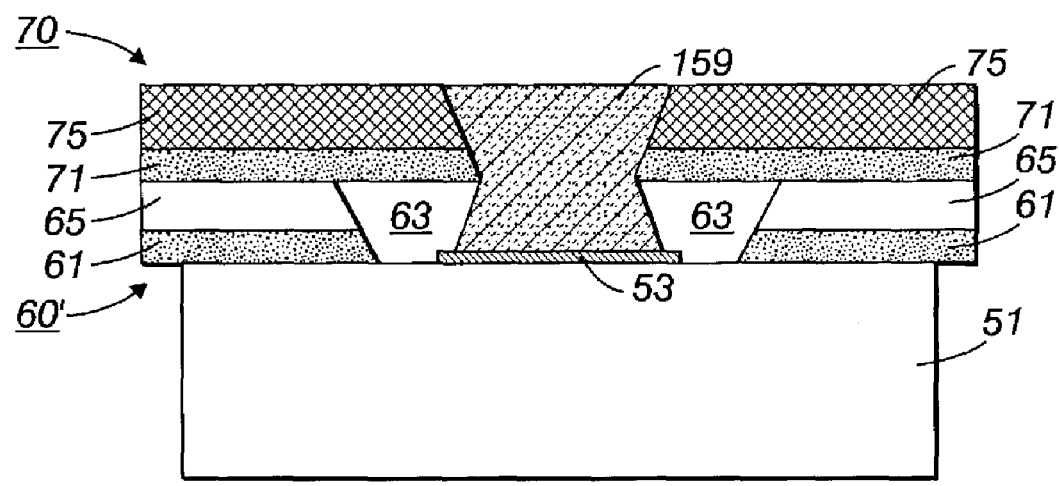

In FIG. 7, a conductive paste 159 is applied through the mask apertures 73 and the standoff apertures 63. The conductive paste 159 can comprise silver epoxy, for example. The conductive paste 159 can also comprise low melt solder pastes such as indium alloy powders suspended in a flux.

Figure 8:
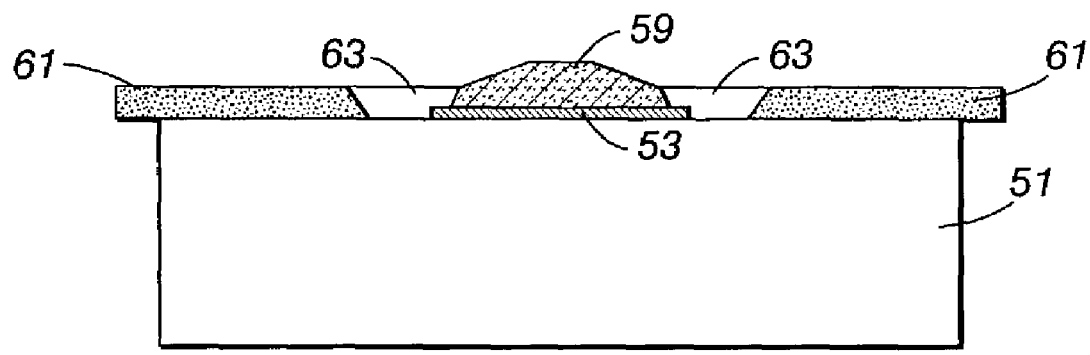

In FIG. 8, the front liner 65 and the laminate mask structure 70 comprised of the mask liner layer 75 and the mask adhesive layer 71 are removed to expose the standoff adhesive layer 61 and islands of conductive epoxy 59.

Figure 9:
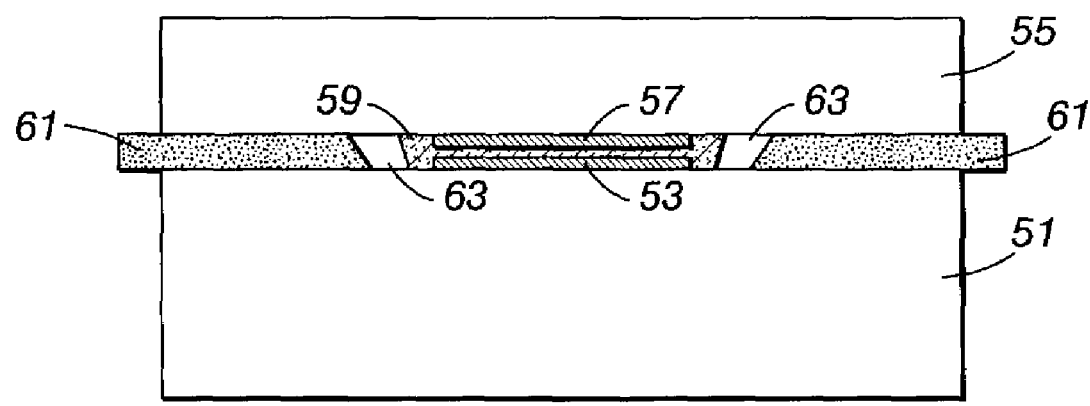

In FIG. 9, a second electrical circuit structure 55 is attached to the standoff adhesive layer 61 and the islands of conductive paste 59.

The invention has been described with reference to disclosed embodiments, and it will be appreciated that variations and modifications can be affected within the spirit and scope of the invention.

What is claimed is:

1. A standoff/mask structure comprising:
   a liner layer;
   an adhesive standoff layer attached to the liner layer;
   a plurality of standoff apertures formed in the liner layer and the adhesive standoff layer;
   a mask adhesive layer attached to the liner layer;
   a mask layer attached to the mask adhesive layer;
   a plurality of mask apertures formed in the mask adhesive layer and the mask layer in alignment with the plurality of standoff apertures;
   the adhesive standoff layer being removably attached to the liner layer such that the liner layer, the mask adhesive layer and the mask layer are removable from the adhesive standoff layer.

2. The standoff/mask structure of claim 1 wherein the standoff apertures have a diameter in the range of about 8 micrometers to about 500 micrometers.

3. The standoff/mask structure of claim 1 wherein the standoff apertures have a diameter in the range of about 8 micrometers to about 500 micrometers and a center to center spacing in the range of about 1.1 times such diameter to about 2 times such diameter.

4. The standoff/mask structure of claim 1 wherein the mask apertures have a diameter in the range of about 5 micrometers to about 250 micrometers.

5. The standoff/mask structure of claim 1 wherein the adhesive standoff layer comprises an adhesive selected from a group consisting of acrylic, epoxy, phenolic, polyimide, and silicone adhesives.

6. The standoff/mask structure of claim 1 wherein the adhesive standoff layer comprises a double-sided tape.

7. The standoff/mask structure of claim 1 wherein the adhesive standoff layer has a thickness in the range of about 1 micrometer to about 500 micrometers.

8. The standoff/mask structure of claim 1 wherein the mask adhesive layer comprises an adhesive selected from the group consisting of a contact adhesive and a UV curable adhesive.

9. The standoff/mask structure of claim 1 wherein the mask adhesive layer has a thickness in the range of 1 micrometer to about 500 micrometers.

10. The standoff/mask structure of claim 1 wherein the mask adhesive layer has a thickness in the range of about 5 micrometers to about 50 micrometers.

11. The standoff/mask structure of claim 1 wherein each of the liner layer and the mask layer comprises a material selected from a group consisting of polyester, polyimide, polyamide, polyetherimide, polysulfone, polyethersulfone, polyetheretherketone, and polyphenylenesulfide.

12. The standoff/mask structure of claim 1 wherein each of the liner layer arid the mask layer has a thickness in the range of about 1 micrometer to about 500 micrometers.

13. The standoff/mask structure of claim 1 wherein each of the liner layer and the mask layer has a thickness in the range of about 10 micrometers to about 100 micrometers.

14. A method of making a standoff/mask structure comprising:
   forming a plurality of apertures in a first laminate structure that includes a first adhesive layer disposed between a first liner layer and a second liner layer;
   attaching a second laminate structure to the first laminate structure, wherein the second laminate structure comprises a second adhesive layer and a third liner layer; and
   forming a plurality of apertures in the second laminate structure in alignment with the apertures in the first laminate structure.

15. The method of claim 14 wherein forming a plurality of apertures in a first laminate structure comprises laser cutting a plurality of apertures in a first laminate structure that includes a first adhesive layer disposed between a first liner layer and a second liner layer.

16. The method of claim 14 wherein forming a plurality of apertures in the second laminate structure comprises laser culling a plurality of apertures in the second laminate structure in alignment with the apertures in the first laminate structure.

17. The method of claim 14 wherein the apertures in the first laminate structure have a diameter in the range of about 8 micrometers to about 500 micrometers.

18. The method of claim 14 wherein the apertures in the first laminate structure have a diameter in the range of about 8 micrometers to about 500 micrometers and a center to center spacing of about 1.5 times such diameter.

19. The method of claim 14 wherein the apertures in the second laminate structure have a diameter in the range of about 5 micrometers to about 250 micrometers.

20. A standoff/mask structure made in accordance with the method of claim 14.

21. A method of making an interconnected electrical circuit structure comprising:
   applying a laminate standoff/mask structure over a plurality of contact regions of a first electrical circuit structure, wherein the multi-layer standoff/mask structure includes an adhesive standoff having a plurality of standoff openings aligned with the contact regions and a mask having a plurality of mask openings aligned with the standoff openings;
   applying a conductive paste through the mask openings and the standoff openings so as to form conductive bumps on the plurality of contact regions of the first electrical circuit structure;
   removing the mask; and
   attaching a second electrical circuit structure to the standoff and the conductive bumps.

22. The method of claim 21 wherein the first circuit structure comprises one of the group consisting of a circuit board, a flexible circuit, an electromechanical device, an integrated circuit die, a semiconductor package, a thick film circuit, and a ceramic circuit board.

23. The method of claim 21 wherein the second circuit structure comprises one of the group consisting of a circuit board, a flexible circuit, an electromechanical device, an integrated circuit die, a semiconductor package, a thick film circuit, and a ceramic circuit board.

24. An interconnected electrical circuit structure made in accordance with the method of claim 21.

25. A method of making an interconnected electrical circuit structure comprising:
   applying a laminate standoff/mask structure over a plurality of contact regions of a first electrical circuit structure, wherein the multi-layer standoff/mask structure includes an adhesive standoff layer and a standoff carrying flexible liner having a plurality of standoff openings aligned with the contact regions, and a mask adhesive layer and a mask having a plurality of mask openings aligned with the standoff openings;
   applying a conductive paste through the mask openings so as to form conductive bumps on the plurality of contact regions of the first electrical circuit structure;
   removing the standoff carrying liner, the mask adhesive layer and the mask; and
   attaching a second electrical circuit structure to the standoff and the conductive bumps.

* * * * *